(12) United States Patent
Kim et al.

(10) Patent No.: US 8,473,668 B2
(45) Date of Patent: Jun. 25, 2013

(54) MEMORY DEVICE AND WEAR LEVELING METHOD

(75) Inventors: Yong June Kim, Seoul (KR); Jae Hong Kim, Seoul (KR); Kyoung Lae Cho, Yongin-si (KR); Jun Jin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 886 days.

(21) Appl. No.: 12/379,273

(22) Filed: Feb. 18, 2009

(65) Prior Publication Data

US 2010/0027335 A1 Feb. 4, 2010

(30) Foreign Application Priority Data

Jul. 31, 2008 (KR) .................. 10-2008-0075020

(51) Int. Cl.
*G06F 12/00* (2006.01)

(52) U.S. Cl.
USPC .... 711/103; 711/154; 711/165; 711/E12.008; 365/185.09

(58) Field of Classification Search
None
See application file for complete search history.

(56) References Cited

U.S. PATENT DOCUMENTS

2009/0138654 A1* 5/2009 Sutardja ................. 711/103

FOREIGN PATENT DOCUMENTS

| JP | 2004-310650 | 11/2004 |
| KR | 10-2005-0050148 | 5/2005 |
| KR | 10-2005-0083850 | 8/2005 |
| KR | 10-2007-0061345 | 6/2007 |
| WO | WO 2004/040585 | 5/2004 |

* cited by examiner

*Primary Examiner* — Reginald Bragdon
*Assistant Examiner* — Arvind Talukdar
(74) *Attorney, Agent, or Firm* — Harness, Dickey & Pierce, P.L.C.

(57) ABSTRACT

The memory device selects any one of a first memory cell and a second memory cell based on a number of times that the first memory cell is erased, an elapsed time after the first memory cell is erased, a number of times that the second memory cell is erased, and an elapsed time after the second memory cell is erased, and program data in the selected memory cell. The memory device may improve distribution of threshold voltage of memory cells and endurance of the memory cells.

14 Claims, 8 Drawing Sheets

MEMORY DEVICE AND WEAR LEVELING METHOD

PRIORITY STATEMENT

This application claims the benefit of Korean Patent Application No. 10-2008-0075020, filed on Jul. 31, 2008, in the Korean Intellectual Property Office (KIPO), the entire contents of which are incorporated herein by reference.

BACKGROUND

1. Field

Example embodiments relate to apparatuses and/or methods of performing a wear leveling with respect to memory cells of a memory device. Also, example embodiments relate to apparatuses and/or methods of performing a wear leveling with respect to memory cells that may be applied to a memory device that changes a threshold voltage of the memory cells and stores data.

2. Description of the Related Art

A non-volatile semiconductor memory, one of various storage mediums that can maintain stored data even when power is out, is widely used. One representative non-volatile memory is a flash memory, has advantages of a smaller size, less power consumption, and higher reading rate compared to a conventional Hard Disk Drive (HDD). Recently, a Solid State Disk (SSD) is suggested to replace the HDD by using flash memory as mass storage.

Representative flash memories may include a NAND flash memory, NOR flash memory, and the like. A method based on NAND and a method based on NOR are discriminated by different cell array configurations and operation methods.

The flash memory is composed of an arrangement of a plurality of memory cells and a single memory cell may store at least one data bit. The single memory cell includes a control gate and floating gate. Also, an insulator insulates between the control gate and the floating gate, and another insulator insulates between the floating gate and a substrate.

An operation of storing data to the memory cell of the flash memory is called programming and an operation of erasing a program or data is performed by a hot carrier effect or a Fowler-Nordheim Tunneling (F-N tunneling) mechanism.

SUMMARY

Example embodiments may provide a memory device and a wear leveling method. At least one embodiment performs a wear leveling based on a number of times that a memory cell is erased as well as an elapsed time after a memory cell is erased, and may thereby improve endurance of the memory cell.

At least one example embodiment may provide a memory device and a wear leveling method which provides a predetermined or reference period of time for a memory cell to recover, and may thereby reduce distortion of a threshold voltage of the memory cell.

A memory device according to at least one example embodiment includes: a memory cell array including a first memory cell and a second memory cell; and a control unit to select any one of the first memory cell and the second memory cell based on a number of times that the first memory cell is erased, an elapsed time after the first memory cell is erased, a number of times that the second memory cell is erased, and an elapsed time after the second memory cell is erased; and a programming unit to program data in the selected memory cell.

According to another example embodiment, a wear leveling method includes: generating a first parameter based on a number of times that a first memory cell is erased and an elapsed time after the first memory cell is erased; generating a second parameter based on a number of times that a second memory cell is erased and an elapsed time after the second memory cell is erased; selecting any one of the first memory cell and the second memory cell based on the first parameter and the second parameter; and programming data in the selected memory cell.

BRIEF DESCRIPTION OF THE DRAWINGS

The above and other characteristics of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EMBODIMENTS

Figure 1:
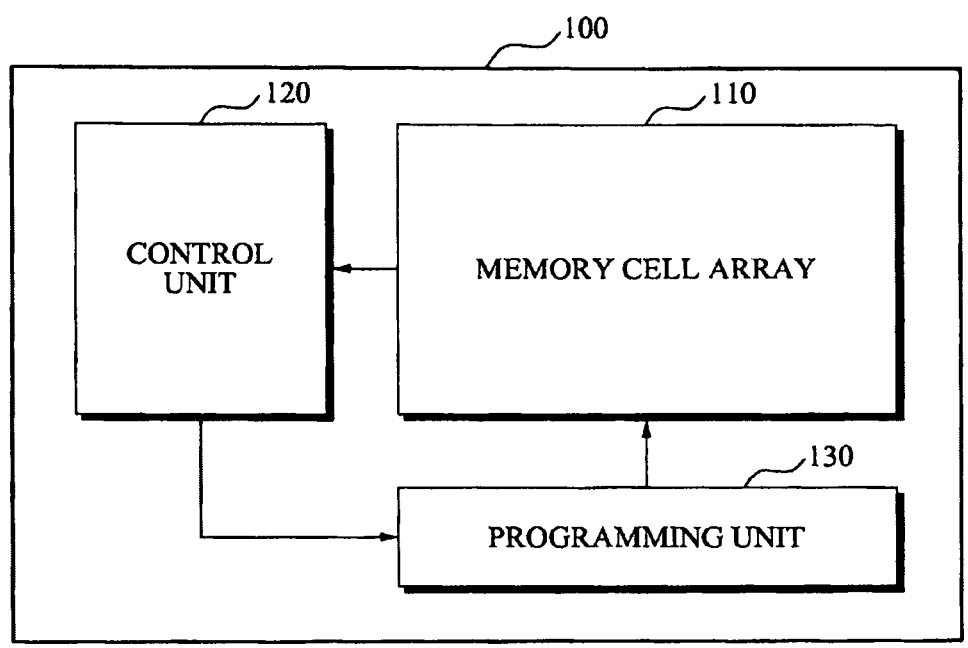
FIG. 1 is a block diagram illustrating a memory device according to an example embodiment.

Detailed example embodiments are disclosed herein. However, any structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or characteristic to another component and/or characteristic, or other component(s) and/or characteristic(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated characteristics, integers, steps, operations, elements, and/or components, but do not preclude the presence or addition of one or more other characteristics, integers, steps, operations, elements, and/or components.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Example embodiments of the present disclosure may be applicable to a memory device that stores data by changing a threshold voltage of a memory cell. Examples of the memory device may include, for example, a flash memory, Electrically Erasable Programmable Read Only Memory (EEPROM), Phase Shift Random Access Memory (PRAM), Magnetic Random Access Memory (MRAM), and the like.

A memory cell of a non-volatile memory device may be classified into a single level cell or multi-level cell according to a density of data to be stored.

The single-level cell (SLC) is a memory that may store one bit data to a single memory cell. The SLC may also be called a single-bit cell (SBC). A process that stores data to a memory cell (single-level cell) of a SLC memory is called a program process and may change a threshold voltage of the memory cell. For example, when data with a logic value "1" is stored in the SLC, the SLC may have a 1.0 V threshold voltage, and when data with a logic value "0" is stored in the SLC, the SLC may have a 3.0 V threshold voltage.

A threshold voltage of each SLC where the same data is programmed may have a certain range of distribution due to a minute electric characteristic difference between the SLCs. For example, when a voltage read from the memory cell is 0.5 V to 1.5 V, the data stored in the memory cell may have a logic "1" and when the voltage read from the memory cell is 2.5 V to 3.5 V, the data stored in the memory cell may have a logic "0". The data stored in the memory cell may be discriminated according to an electric current/voltage difference of the memory cell when the electric current/voltage of the memory cell is sensed.

A multi-level cell (MLC) memory may program two or more bits of data in a single memory cell. The MLC memory may also be referred to as a multi-bit cell (MBC) memory. The MLC may increase a density of data to be stored. An MLC may be relatively more appropriate for embodying a mass memory. However, as the number of bits stored in the single memory cell increases, reliability may deteriorate and a read-failure rate may increase. When m-bit data is programmed to the single memory cell, one of $2^m$ threshold voltages may be required to be formed in the memory cell. Threshold voltages of memory cells in which the same data is programmed may have a certain range of distribution due to a minute electric characteristic difference between the memory cells. As a result, each of the threshold voltages may respectively correspond to each of $2^m$ data values that may be generated through m bits.

However, since a voltage window of the memory may be limited, as m increases, a distance between $2^m$ distributions of thresholds voltages of neighboring bits may decrease, and as the distance decreases, the neighboring distributions may be overlapped. When the neighboring distributions overlap each other, the read-failure rate may increase.

FIG. 1 is a block diagram illustrating a memory device 100 according to an example embodiment.

Referring to FIG. 1, the memory device 100 may include a memory cell array 110, control unit 120, and programming unit 130.

The memory cell array 110 may include a plurality of memory cells.

Each of the plurality of memory cells may be identified by a row and column. Memory cells included in a single row may be connected to, for example, a single word line. Memory cells included in a single column may be connected to, for example, a single bit line.

A memory cell may include a gate terminal composed of, for example, metal or poly-silicon and also may include a floating gate (FG) between the gate terminal and the channel. The FG may be composed of, for example, metal or poly-silicon.

The memory device 100 may store a carrier in the FG of the memory cell. When the carrier is stored in the FG, a threshold voltage of the memory cell may change.

A Fowler-Nordheim (F-N) tunneling or Hot Carrier Effect (HCE) may be used to store the carrier in the FG. The carrier may be at least one of an electron, a hole, and the like.

The programming unit 130 may determine a target threshold voltage based on a value of data to be stored in the memory cell. The programming unit 130 may repeat the process of storing the carrier in the FG until a threshold voltage of the memory cell corresponds to the target threshold voltage. The programming unit 130 may remove the carrier stored in the FG of the memory cell to erase the data stored in the memory cell.

A process where the programming unit 130 stores the carrier in the FG of the memory cell in order to store data may be referred to as a program process. A process where the programming unit 130 removes the carrier stored in the FG of the memory cell to erase the data may be referred to as an erase process.

In order for the memory device 100 to store (program) the data in the memory cell, the memory cell may be erased first. A cycle where the memory device 100 programs the data in the memory cell and erases the memory cell may be referred to as a Program/Erase (P/E) cycle.

As a number of times that the program process and the erase process are repeated increases, charge retention characteristics of the memory cell may be degraded. The program process may correspond to a process where the carrier is accumulated in the FG. The erase process may correspond to a process where the carrier is leaked from the FG.

As the program and erase processes are repeated, a boundary between the FG and an insulator around the FG may be damaged. Also, an insulator between the FG and a channel may be damaged. The above-described damages may cause diffusion and a leaking path. The carrier accumulated in the FG may be lost due to the diffusion, or leaked from the FG due to the leaking path.

When the charge retention characteristics are degraded, the threshold voltage of the programmed memory cell may experience an undesired change. The data stored in the memory cell may be corrupted due to the changes.

When a target memory cell where data is to be programmed is selected from among the plurality of memory cells, the memory device 100 may select the target memory cell based on a number of times that each of the plurality of memory cells has been erased. The memory device 100 may select a memory cell having been erased a fewest number of times from the plurality of memory cells as the target memory cell.

The memory device 100 may equalize the number of times that each of the plurality of memory cells is erased. A process to equalize the number of times that each of the plurality of memory cells is erased may be referred to as a wear leveling.

A set of memory cells simultaneously erased by the memory device 100 may be referred to as an erase block or block. Since a number of times that each of a plurality of memory cells included in a single block have been erased may be identical, the memory device 100 may perform a block-based wear leveling.

A first memory cell and a second memory cell of a plurality of memory cells included in the memory cell array 110 are described for convenience of description. However the memory cell array 110 may include any number of memory cells.

The memory device 100 may perform a wear leveling with respect to the first memory cell based on a number of times that the first memory cell has been erased and an elapsed time after the first memory cell has been erased. Additionally, the memory device 100 may perform a wear leveling with respect to the second memory cell based on a number of times that the second memory cell has been erased and an elapsed time after the second memory cell is erased.

The control unit 120 may select any one of the first memory cell and the second memory cell based on the number of times that the first memory cell has been erased, the elapsed time after the first memory cell is erased, the number of times that the second memory cell has been erased, and the elapsed time after the second memory cell is erased.

The programming unit 130 may program data in the selected memory cell.

The control unit 120 may generate a first parameter based on the number of times that the first memory cell has been erased and the elapsed time after the first memory cell is erased. Also, the control unit 120 may generate a second parameter based on the number of times that the second memory cell has been erased and the elapsed time after the second memory cell is erased.

The control unit 120 may increase the first parameter as the number of times that the first memory cell has been erased increases, and decrease the first parameter as the elapsed time after the first memory cell is erased increases. Also, the control unit 120 may increase the second parameter as the number of times that the second memory cell has been erased increases, and decrease the second parameter as the elapsed time after the second memory cell is erased increases.

The control unit 120 may set a function $f(t1)$ with respect to the elapsed time after the first memory cell is erased, $t1$. A result of the function $f(t1)$ may have no dimension. The control unit 120 may generate a value, obtained by subtracting the function $f(t1)$ from the number of times that the first memory cell has been erased, as the first parameter. According to an example embodiment, the first parameter may be an effective P/E cycle of the first memory cell.

Similarly, the control unit 120 may set a function $f(t2)$ with respect to the elapsed time after the second memory cell is erased, $t2$. The control unit 120 may generate a value, obtained by subtracting the function $f(t2)$ from the number of times that the second memory cell is erased, as the second parameter. According to an example embodiment, the second parameter may be an effective P/E cycle of the second memory cell.

The functions $f(t1)$ and $f(t2)$ may be design parameters that can be empirically determined.

When the first parameter is greater than the second parameter, the control unit 120 may select the second memory cell. When the first parameter is less than the second parameter, the control unit 120 may select the first memory cell.

When the number of times that the first memory cell is erased is greater than or equal to a first threshold value, the control unit 120 may not select the first memory cell until the elapsed time after the first memory cell is erased is greater than or equal to a second threshold value. The memory device 100 may thereby provide a predetermined or reference period of time for the first cell, which may be damaged after being erased, to recover. Since the first memory cell may recover after time corresponding to the second threshold value for the first memory cell passes, charge retention characteristics of the first memory cell may be improved.

The first and second threshold values may be design parameters that can be empirically determined.

After time corresponding to the second threshold value for the first memory cell passes, a boundary between an insulator and a FG of the first memory cell may recover from the damage. Also, an insulator between a channel and the FG of the first memory cell may be recover from the damage.

In this instance, as the first threshold value increases, the second threshold value may increase. As the number of times that the first memory cell has been erased increases, the control unit 120 may provide a longer time until the first memory cell is reused after being erased.

As the elapsed time after the first memory cell is erased, $t1$, increases, a recovery degree of the first memory cell may non-linearly increase. The memory device 100 may determine the function f(t1) based on the recovery degree of the first memory cell according to the increase in the elapsed time, t1.

When the number of times that the first memory cell has been erased is equal to or similar to the number of times that the second memory cell has been erased, for example, when a difference between the number of times that the first memory cell has been erased and the number of times that the second memory cell has been erased is equal to or less than a third threshold value, the control unit 120 may compare the elapsed time after the first memory cell is erased to the elapsed time after the second memory cell is erased. The third threshold value may vary depending on settings. For example, the third threshold value may be determined to be 10% of the number of times that the first memory cell has been erased or the number of times that the second memory cell has been erased. However, according to example embodiments, the third threshold value may not be limited to the above-described example.

When the difference between the number of times that the first memory cell has been erased and the number of times that the second memory cell has been erased is equal to or less than the third threshold value, the control unit 120 may compare the elapsed time after the first memory cell is erased to the elapsed time after the second memory cell is erased.

When the elapsed time after the first memory cell is erased is greater than the elapsed time after the second memory cell is erased by at least a fourth threshold value, the first memory cell may be selected. The fourth threshold value may be adjusted based on the third threshold value.

The control unit 120 may store the elapsed time after the first memory cell is erased as metadata of the first memory cell. Also, the control unit 120 may store the elapsed time after the second memory cell is erased, as metadata of the second memory cell.

The memory cell array 110 may include at least one monitoring cell. The at least one monitoring cell may store test data without storing effective data. The memory device 100 may monitor a threshold voltage of the monitoring cell. The memory device 100 may trace a change of the threshold voltage of the monitoring cell, and may thereby estimate an elapsed time after a memory cell associated with the monitoring cell has been erased.

For example, it may be assumed that a first block includes the first memory cell, and a second block includes the second memory cell. The first block may include a first monitoring cell and the second block may include a second monitoring cell.

The memory device 100 may estimate the elapsed time after the first memory cell is erased based on a change of a threshold voltage of the first monitoring cell, and estimate the elapsed time after the second memory cell is erased based on a change of a threshold voltage of the second monitoring cell.

Figure 2:
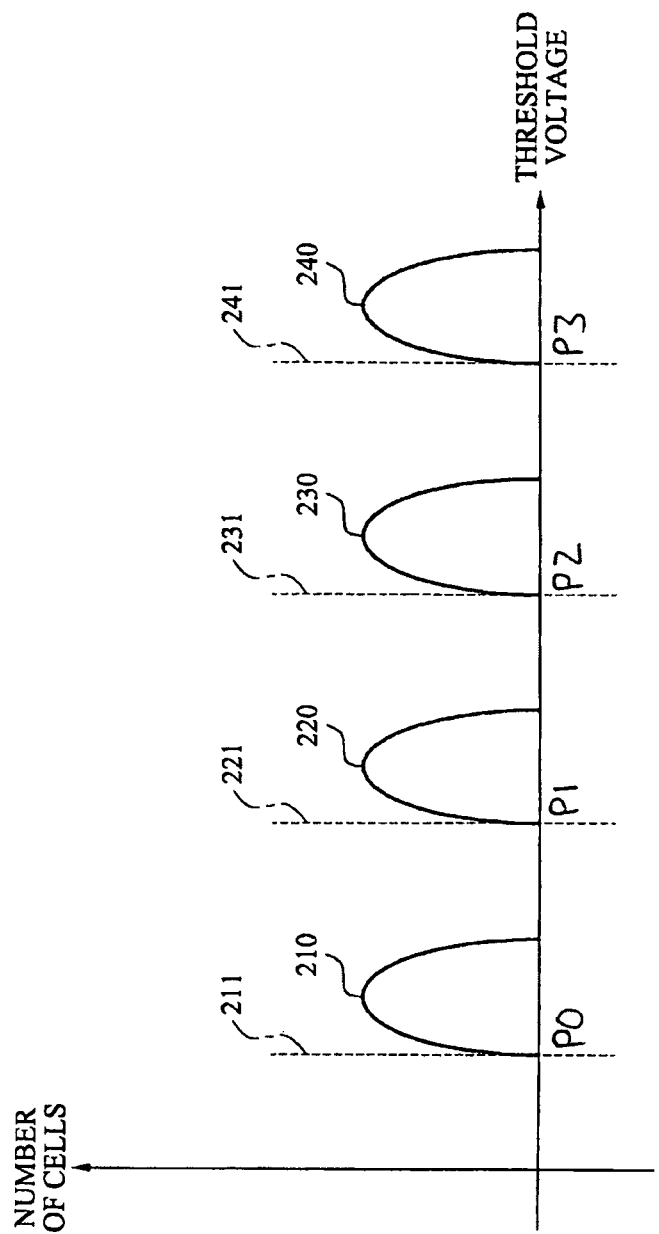
FIG. 2 is a graph illustrating an example of a distribution formed by a program process of the memory device of FIG. 1.

FIG. 2 is a graph illustrating an example of distribution formed by a program process of the memory device 100 of FIG. 1.

A programming unit 130 may determine a target threshold voltage of a memory cell where data "11" is to be stored, as a voltage level 211. The programming unit 130 may control a threshold voltage of the memory cell based on the determined target threshold voltage.

Since a characteristic of each of a plurality of memory cells may be slightly different, threshold voltages of the memory cells storing the data "11" may form a distribution 210.

Similarly, threshold voltages of memory cells storing data "10" may form a distribution 220 based on a program process of the programming unit 130. Additionally, threshold voltages of memory cells storing data "00" may form a distribution 230, and threshold voltages of memory cells storing data "01" may form a distribution 240.

The programming unit 130 may determine a target threshold voltage of a memory cell where the data "10" is to be stored, as a voltage level 221. The programming unit 130 may increase a threshold voltage of each of a plurality of memory cells where the data "10" is to be stored up to a value equal to or greater than the target threshold voltage. When the programming unit 130 increases the threshold voltages of all the plurality of memory cells where the data "10" is to be stored up to a value equal to or greater than the voltage level 221, the threshold voltages of the plurality of memory cells where the data "10" is to be stored may form the distribution 220.

The programming unit 130 may determine a target threshold voltage of a memory cell where the data "00" is to be stored, as a voltage level 231. Also, the programming unit 130 may determine a target threshold voltage of a memory cell where the data "01" is to be stored, as a voltage level 241.

When the programming unit 130 increases threshold voltages of all the memory cells where the data "00" is to be stored up to a value equal to or greater than the voltage level 231, the threshold voltages of all the memory cells where the data "00" is to be stored may form the distribution 230.

When the programming unit 130 increases threshold voltages of all the memory cells where the data "01" is to be stored up to a value equal to or greater than the voltage level 241, the threshold voltages of all the memory cells where the data "01" is to be stored may form the distribution 240.

The distribution 210 may correspond to a threshold voltage state P0. Additionally, the distribution 220, the distribution 230, and the distribution 240 may correspond to a threshold voltage state P1, a threshold voltage state P2, and a threshold voltage state P3, respectively.

The memory device 100 may predict the distributions 210, 220, 230, and 240 after the program process based on a target threshold voltage. Accordingly, the memory device 100 may set a plurality of reference threshold voltage intervals and assign decision data with respect to the plurality of reference threshold voltage intervals.

Figure 3:
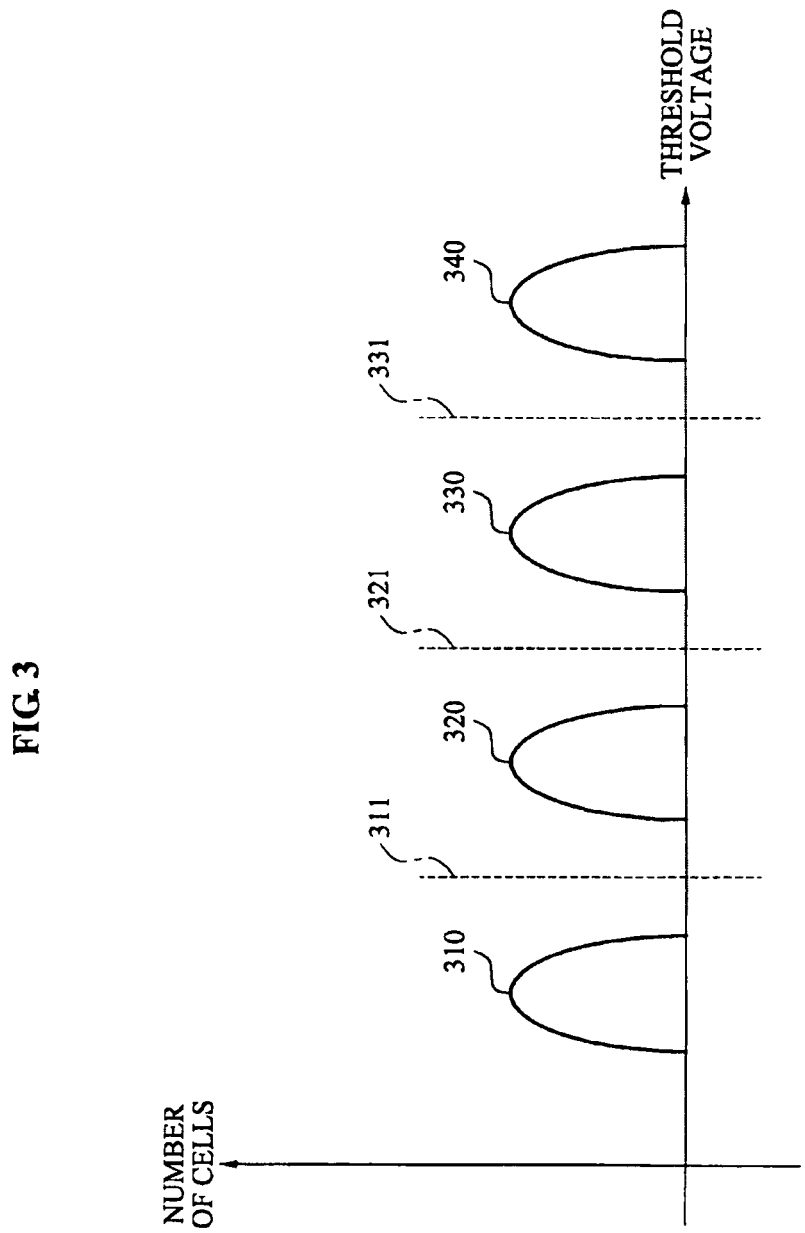
FIG. 3 is a graph illustrating an example of data decision process of the memory device of FIG. 1.

FIG. 3 is a graph illustrating an example of data decision process of the memory device 100 of FIG. 1.

A distribution 310 is associated with threshold voltages of a plurality of memory cells where data "11" is programmed. A distribution 320, a distribution 330, and a distribution 340 are associated with threshold voltages of a plurality of memory cells where data "10", data "00", and data "01" are programmed, respectively.

The memory device 100 may simultaneously measure threshold voltages of a plurality of memory cells. For example, the memory device 100 may simultaneously measure whether the threshold voltages of the plurality of memory cells are higher than a read level 321.

The memory device 100 may determine a threshold voltage range of each of the plurality of memory cells using a read level 311, a read level 321, and/or a read level 331. The memory device 100 may assign decision data with respect to four threshold voltage intervals divided by the read level 311, the read level 321, and the read level 331.

The memory device 100 may determine data stored in a memory cell with a threshold voltage less than the read level 311, as the data "11". According to an example embodiment, it may be determined that the data "11" is assigned to a reference threshold voltage interval corresponding to the threshold voltage less than the read level 311.

The memory device 100 may determine data stored in a memory cell with a threshold voltage greater than the read level 311 and less than the read level 321, as the data "10". According to an example embodiment, it may be determined that the data "10" is assigned to a reference threshold voltage interval corresponding to the threshold voltage greater than the read level 311 and less than the read level 321.

The memory device 100 may determine data stored in a memory cell with a threshold voltage, greater than the read level 321 and less than the read level 331, as the data The memory device 100 may determine data stored in a memory cell with a threshold voltage, greater than the read level 331, as the data "01".

The memory device 100 may use the three read levels 311, 321, and 331 to determine two-bit data, which is referred to as an 'integral read'. In the integral read, decision data may be assigned to each threshold voltage interval, and a hard decision is used.

The memory device 100 may determine a threshold voltage range of each of the plurality of memory cells using a greater number of read levels than the integral read, which may be referred to as a fractional read. The memory device 100 may represent data stored in each of the plurality of memory cells as a probability using a plurality of read levels, not illustrated in FIG. 3, as well as the three read levels 311, 321, and 331, and may use a soft decision process.

As a number of times that a memory cell has been erased increases, damage of the memory cell may increase. Accordingly, as described above, an amount of carriers accumulated in a FG of the memory cell may change. According to an example embodiment, the change of the amount of the carriers is not desired, and a threshold voltage of the memory cell after data is programmed may change due to the undesired change.

An error may occur, when the threshold voltage is not in a predicted reference threshold voltage interval since the threshold voltage of the memory cell may change after the data is programmed.

The memory device 100 may provide a predetermined or reference period of time for the memory cell to recover from the damage after the memory cell is erased, and may thereby reduce the undesired change of the threshold voltage of the memory cell that may be caused by the damage. Accordingly, the memory device 100 may reduce the change of the threshold voltage of the memory cell, and may thereby reduce an error of the data decision process.

The memory device 100 may perform a wear leveling based on a number of times that a memory cell has been erased as well as an elapsed time after the memory cell is erased, and may thereby improve endurance of the memory cell.

Figure 4:
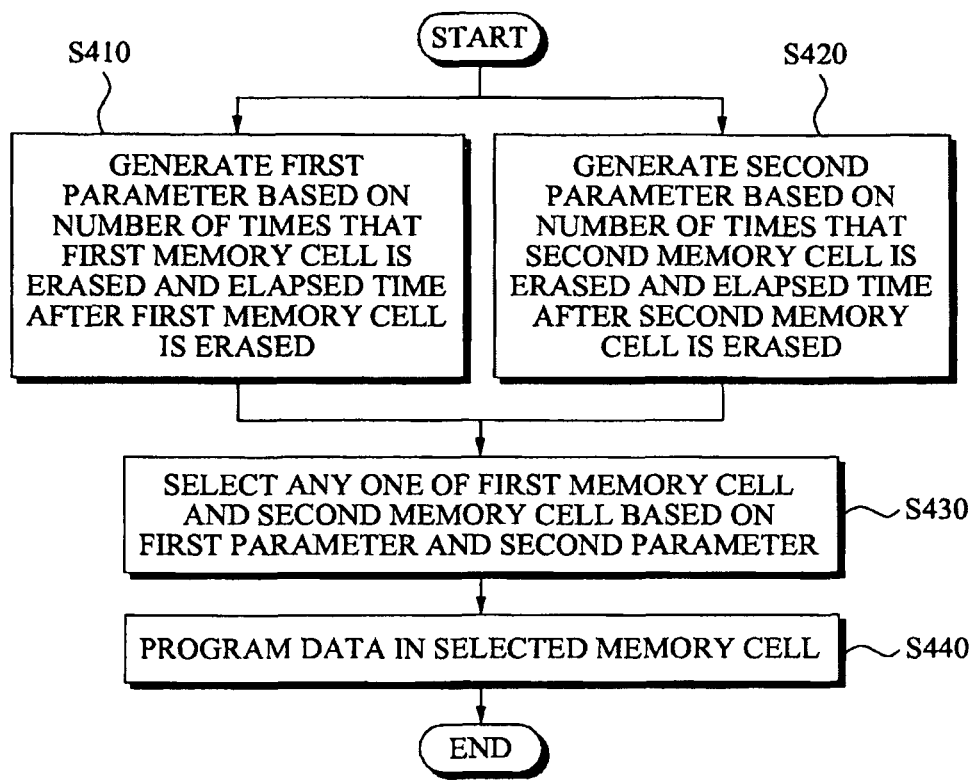
FIG. 4 is a flowchart illustrating a wear leveling method according to an example embodiment.

FIG. 4 is a flowchart illustrating a wear leveling method according to an example embodiment.

Referring to FIG. 4, in operation S410, the wear leveling method may generate a first parameter based on a number of times that a first memory cell has been erased and an elapsed time after the first memory cell is erased.

In operation S420, the wear leveling method may generate a second parameter based on a number of times that a second memory cell has been erased and an elapsed time after the second memory cell is erased.

In operation S430, the wear leveling method may select any one of the first memory cell and the second memory cell based on the first parameter and the second parameter.

In operation S440, the wear leveling method may program data in the memory cell selected from the first and second memory cells.

According to an example embodiment, the generating of the first parameter in operation S410 and the generating of the second parameter in operation S420 may be performed simultaneously.

In operation S410, the wear leveling method may increase the first parameter as the number of times that the first memory cell has been erased increases. Also, in operation S410, the wear leveling method may decrease the first parameter as the elapsed time after the first memory cell is erased increases.

In operation S420, the wear leveling method may increase the second parameter as the number of times that the second memory cell has been erased increases. Also, in operation S420, the wear leveling method may decrease the second parameter as the elapsed time after the second memory cell is erased increases.

In operation S430, the wear leveling method may select the second memory cell when the first parameter is greater than the second parameter.

Figure 5:
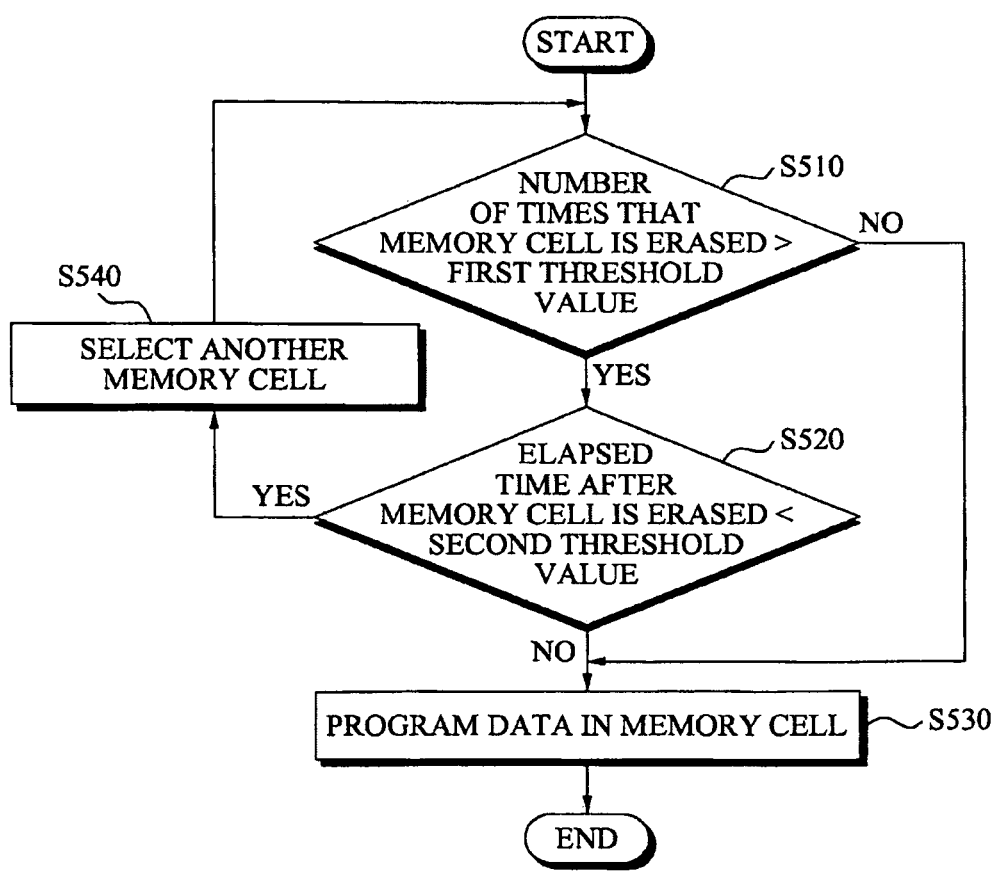
FIG. 5 is a flowchart illustrating a wear leveling method according to another example embodiment.

FIG. 5 is a flowchart illustrating a wear leveling method according to another example embodiment.

Referring to FIG. 5, in operation S510, the wear leveling method may determine whether a number of times that a memory cell has been erased is greater than a first threshold value.

When the number of times that the memory cell has been erased is greater than the first threshold value, the wear leveling method may determine whether an elapsed time after the memory cell is erased is less than a second threshold value in operation S520.

Conversely, when the number of times that the memory cell is erased is less than or equal to the first threshold value, the wear leveling method may program data in the memory cell in operation S530.

When the elapsed time after the memory cell is erased is less than the second threshold value, the wear leveling method may select any one of remaining memory cells excluding a current memory cell in operation S540.

When the elapsed time after the memory cell is erased is greater than or equal to the second threshold value, the wear leveling method may program data in the memory cell in operation S530.

The wear leveling method according to example embodiments may be recorded in a physical computer-readable media including program instructions to implement various operations embodied by a computer. The media may also include, alone or in combination with the program instructions, data files, data structures, and/or the like. The media and program instructions may be those especially designed and constructed for the purposes of example embodiments, or they may be of the kind well-known and available to those having skill in the computer software arts. Examples of computer-readable media may include, for example, magnetic media, for example hard disks, floppy disks, and magnetic tape; optical media, for example CD ROM disks and DVD; magneto-optical media, for example optical disks; and hardware devices that are especially configured to store and perform program instructions, for example read-only memory (ROM), random access memory (RAM), flash memory, and the like. Examples of program instructions include both machine code, for example produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In example embodiments, the memory controllers may be constructed to communicate with an external device for example, a host using any one of various types of protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that may maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system, according to example embodiments, may include a microprocessor that may be electrically connected with a bus, a user interface, a modem, for example a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage to the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Figure 6:
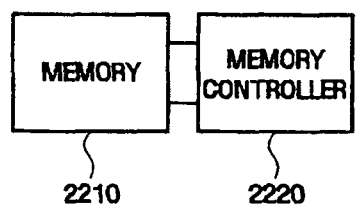
FIG. 6 is a block diagram illustrating an example embodiment of a memory device including a memory connected to a memory controller.

FIG. 6 illustrates an example embodiment of an application of the memory device. As shown, this embodiment includes a memory 2210 connected to a memory controller 2220. The memory 2210 may be any of the memory device embodiments described above. The memory controller 2220 supplies the input signals for controlling operation of the memory 2210.

Figure 7:
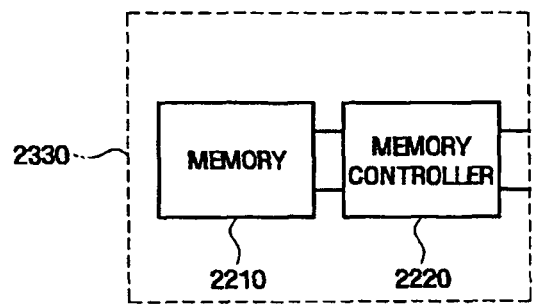
FIG. 7 is a block diagram illustrating the memory device of FIG. 6 included in a card.

FIG. 7 illustrates yet another embodiment. This embodiment is the same as the embodiment of FIG. 6, except that the memory 2210 and memory controller 2220 have been embodied as a card 2330. For example, the card 2330 may be a memory card such as a flash memory card. Namely, the card 2330 may be a card meeting any industry standard for use with a consumer electronics device such as a digital camera, personal computer, etc. It will be appreciated that the memory controller 2220 may control the memory 2210 based on controls signals received by the card 2330 from another (e.g., external) device.

Figure 8:
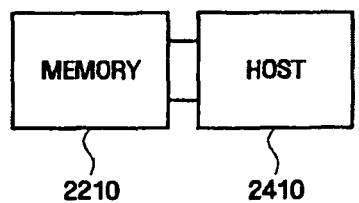
FIG. 8 is a block diagram illustrating an example embodiment of a memory device including a memory connected to a host.

FIG. 8 illustrates a still further embodiment of the present invention. As shown, the memory 2210 may be connected with a host system 2410. The host system 2410 may be a processing system such as a personal computer, digital camera, etc. The host system 2410 may use the memory 2210 as a removable storage medium. As will be appreciated, the host system 2410 supplies the input signals for controlling operation of the memory 2210.

Figure 9:
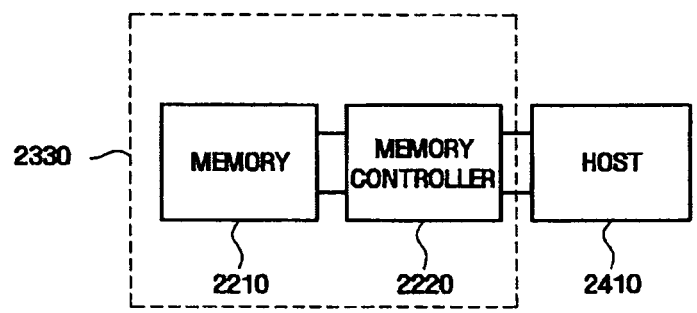
FIG. 9 is a block diagram illustrating the card of FIG. 7 connected to a host.

FIG. 9 illustrates an embodiment of the present invention in which the host system 2410 is connected to the card 2330 of FIG. 7. In this embodiment, the host system 2410 applies control signals to the card 2330 such that the memory controller 2220 controls operation of the memory 2210.

Figure 10:
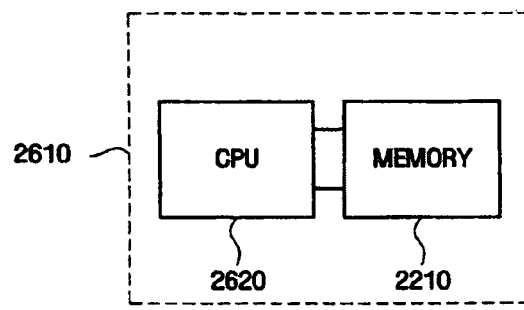
FIG. 10 is a block diagram illustrating an example embodiment of a computer system including a CPU connected to a memory.

FIG. 10 illustrates a further embodiment of the present invention. As shown, the memory 2210 may be connected to a central processing unit (CPU) 2620 within a computer system 2610. For example, the computer system 2610 may be a personal computer, personal data assistant, etc. The memory 2210 may be directly connected with the CPU 2620, connected via bus, etc. It will be appreciated, that FIG. 10 does not illustrate the full complement of components that may be included within a computer system 2610 for the sake of clarity.

Figure 11:
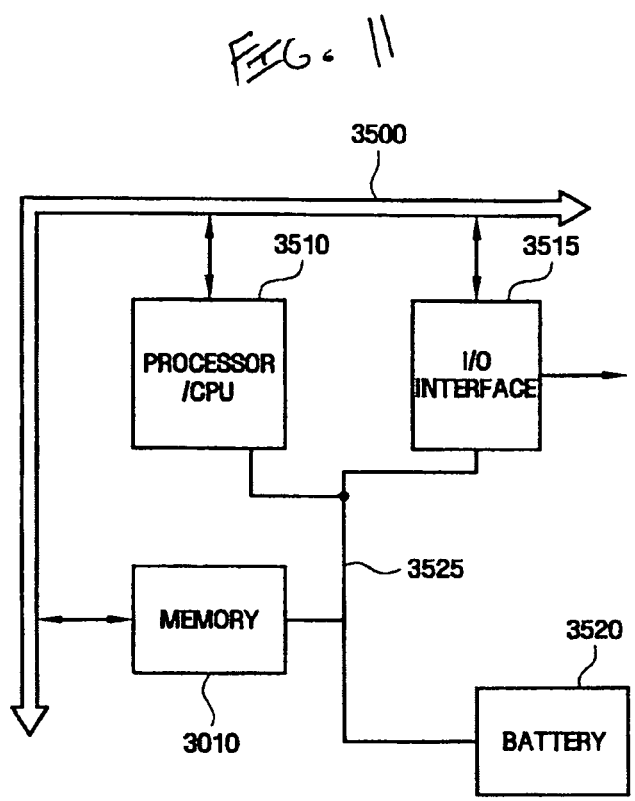
FIG. 11 is a block diagram illustrating a portable application of a memory device according to example embodiments.

FIG. 11 illustrates another embodiment of the present invention. FIG. 11 may represent another portable application of the memory device embodiments described above. As shown, this embodiment includes the memory 3010, which may be any of the memory device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 11, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 11. Furthermore, the present invention is not limited to this architecture. For example, the memory 3010 may be replaced with the embodiment of FIG. 7, and communication with the processor 3510 may be via the memory controller 3020. Furthermore, the I/O interface 3515 may communicate with the memory 3010 via the memory controller 3020, or directly with the memory 3010 if the memory controller 3020 is not present. In portable applications, the above-described components are powered by a battery 3520 via a power supply bus 3525.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
a memory cell array including at least a first memory cell;
a controller configured to determine whether to select the first memory cell based on a number of times that the first memory cell has been erased, and an elapsed time after the first memory cell is erased; and
a programming unit, the programming unit being configured to program data in the first memory cell if the first memory cell is selected by the controller;
wherein the memory cell array further includes a second memory cell;
wherein the controller is configured to select one of the first memory cell and the second memory cell based on a number of times that the second memory cell has been erased, and an elapsed time after the second memory cell is erased, in addition to the number of times that the first memory cell has been erased, and the elapsed time after the first memory cell is erased; and
wherein the programming unit is further configured to program data in the second memory cell if the second memory cell is selected by the controller.

2. The memory device of claim 1, wherein the control unit is configured to generate a first parameter based on the number of times that the first memory cell has been erased and the elapsed time after the first memory cell is erased, is configured to generate a second parameter based on the number of times that the second memory cell has been erased and the elapsed time after the second memory cell is erased; and is configured to select one of the first memory cell and the second memory cell based on the first parameter and the second parameter.

3. The memory device of claim 2, wherein the control unit is configured to increase the first parameter as the number of times that the first memory cell has been erased increases, decrease the first parameter as the elapsed time after the first memory cell is erased increases, increase the second parameter as the number of times that the second memory cell has been erased increases, and decrease the second parameter as the elapsed time after the second memory cell is erased increases.

4. The memory device of claim 3, wherein the control unit is configured to select the second memory cell when the first parameter is greater than the second parameter.

5. The memory device of claim 2, wherein the control unit is configured to select the second memory cell when the first parameter is greater than the second parameter.

6. The memory device of claim 1, wherein the control unit is configured to compare the elapsed time after the first memory cell is erased to the elapsed time after the second memory cell is erased, if a difference between the number of times that the first memory cell is erased and the number of times that the second memory cell is erased is equal to or less than a third threshold value, and is configured to select one of the first memory cell and the second memory cell based on the comparison.

7. The memory device of claim 6, wherein the control unit is configured to select the first memory cell, if the elapsed time after the first memory cell is erased is greater than the elapsed time after the second memory cell is erased by at least a fourth threshold value.

8. The memory device of claim 1, wherein the control unit is configured to store, as metadata, the elapsed time after the first memory cell is erased and the elapsed time after the second memory cell is erased.

9. The memory device of claim 1, wherein the control unit is configured to monitor a change of a threshold voltage of a monitoring cell, and estimate the elapsed time after the first memory cell is erased and the elapsed time after the second memory cell is erased based on the monitored result.

10. The memory device of claim 1, wherein the control unit is configured so that, if the number of times that the first memory cell is erased is greater than a first threshold value, the control unit does not select the first memory cell until the elapsed time after the first memory cell is erased is greater than or equal to a second threshold value.

11. The memory device of claim 1, wherein the control unit is configured so that, if the number of times that the first memory cell is erased is not greater than a first threshold value, the control unit selects the first memory cell.

12. The memory device of claim 1, wherein the control unit is configured so that, if the number of times that the first memory cell is erased is greater than a first threshold value, the control unit selects the first memory cell if the elapsed time after the first memory cell is erased is greater than or equal to a second threshold value.

13. The memory device of claim 1, wherein the control unit is configured so that, if the number of times that the first memory cell is erased is not greater than a first threshold value, the control unit selects the first memory cell; and
if the number of times that the first memory cell is erased is greater than a first threshold value, the control unit selects the first memory cell if the elapsed time after the first memory cell is erased is greater than or equal to a second threshold value.

14. The. memory device of claim 13, wherein the control unit is configured so that, if the number of times that the first memory cell is erased is greater than the first threshold value, the control unit does not select the first memory cell until the elapsed time after the first memory cell is erased is greater than or equal to the second threshold value.

* * * * *